United States Patent [19]
Dawson

[11] Patent Number: 5,503,882
[45] Date of Patent: Apr. 2, 1996

[54] METHOD FOR PLANARIZING AN INTEGRATED CIRCUIT TOPOGRAPHY

[75] Inventor: Robert Dawson, Austin, Tex.

[73] Assignee: Advanced Micro Devices, Inc., Sunnyvale, Calif.

[21] Appl. No.: 229,170

[22] Filed: Apr. 18, 1994

[51] Int. Cl.$^6$ .............................. H05H 1/24; B05D 5/12; C23C 16/00; H01L 21/465
[52] U.S. Cl. ..................... 427/579; 427/255.3; 427/99; 437/228; 437/238; 156/662.1
[58] Field of Search ................................. 427/489, 563, 427/574, 579, 96, 99, 255, 255.3, 387; 156/653, 662, 653.1, 662.1; 437/228, 238

[56] References Cited

U.S. PATENT DOCUMENTS

| | | | |
|---|---|---|---|
| 4,407,850 | 10/1983 | Bruce et al. | 427/579 |
| 4,634,496 | 1/1987 | Mase et al. | 427/574 |
| 4,872,947 | 10/1989 | Wang et al. | 427/574 |
| 5,089,442 | 2/1992 | Olmer | 427/574 |
| 5,279,865 | 1/1994 | Chebi et al. | 427/579 |
| 5,286,518 | 2/1994 | Coin et al. | 427/574 |
| 5,314,724 | 5/1994 | Tsukune et al. | 427/489 |
| 5,356,722 | 10/1994 | Nguyen et al. | 427/574 |
| 5,399,389 | 3/1995 | Hieber et al. | 427/579 |

FOREIGN PATENT DOCUMENTS

| 4223374 | 8/1994 | Japan | 427/574 |
|---|---|---|---|

*Primary Examiner*—Marianne Padgett
*Attorney, Agent, or Firm*—Kevin L. Daffer

[57] ABSTRACT

A method is provided for forming a planarization structure of dielectric materials upon a substrate topography. The dielectric materials can be deposited in layers without removing one or more layers in non-contact areas prior to deposition of an overlying interconnect conductors. Alternatively, at least one layer can be entirely removed from the dielectric materials prior to deposition of the overlying interconnect conductors. A plasma oxide is placed between the substrate upper surface and a subsequently deposited TEOS oxide to reduce stress properties and to balance the stress between the TEOS oxide and the plasma oxide. A subsequently placed SOG layer can be used to further planarize the upper surface, wherein a capping layer is deposited above the SOG to prevent or substantially minimize water absorption. The SOG layer can, alternatively, be removed in its entirety in an etch-back procedure prior to capping layer deposition. Removal of the SOG layer prevents outgassing of water during times in which contacts are formed.

8 Claims, 7 Drawing Sheets

METHOD FOR PLANARIZING AN INTEGRATED CIRCUIT TOPOGRAPHY

BACKGROUND OF THE INVENTION

1. Field of the Invention

This invention relates to integrated circuit manufacture and more particularly to a combination of dielectric materials placed upon an integrated circuit topography to form a highly planar interlevel dielectric structure having minimal stress properties.

2. Description of the Relevant Art

Manufacture of an integrated circuit involves numerous processing steps. Electronic devices must be patterned within a semiconductor substrate, and the patterned devices must be interconnected to one another to form a densely arranged integrated circuit. Due to rapid advances in layout density, interconnect between devices may involve numerous levels of interconnect stacked upon each other with a dielectric placed therebetween. Stacking of interconnect must be closely monitored to ensure that the interlevel dielectric is sufficient to electrically isolate the stacked conductors. Moreover, the interlevel dielectrics must be deposited in such a manner as to present a fairly even or smooth (i.e., planar) upper surface upon which a subsequent interconnect layer is placed. If the upper surface of the dielectric is not planar, then subsequent processing problems can occur such as step coverage and depth of focus problems.

Referring now to FIG. 1, a cross-sectional view of a portion of an integrated circuit 10 is shown manufactured according to a prior methodology. Specifically, integrated circuit 10 includes a substrate 12 having an upper surface upon which a plurality of interconnect conductors 14 are arranged. Conductors 14 comprise one level of interconnect and, for illustrative purposes, comprise the first level of interconnect. After conductors 14 are formed, a dielectric material 16 is placed above and between conductors 14. A second level of conductors (not shown) can be placed upon the upper surface of dielectric 16 to form multilevel interconnects. Moreover, another dielectric (not shown) can be placed over the second level of conductors, and the process repeated depending upon the number of interconnect levels desired.

It is important that the interlevel dielectric exhibit numerous mechanical as well as electrical properties. Electrically speaking, the dielectric must be substantially nonconductive and must provide a barrier against movement of mobile ions between conductive overlayers and conductive underlayers. Mechanically speaking, the dielectric must be easily etched, at a substantially uniform etch rate, and must exhibit conformal coverage and, if desired, highly planar coverage above and between uneven or non-planar underlayer. Providing a dielectric which is both conformal as well as having an upper surface which is substantially planar is difficult to achieve.

Referring now to FIG. 2, problems associated with conventional dielectric structures are illustrated. Area 18 of densely patterned conductors 14 requires a substantially planar upper surface of dielectric 16. Thus, dielectric 16 must be conformal, but more importantly, dielectric 16 in area 18 must have an upper surface which is substantially planarized. Densely patterned conductors in area 18 form an uneven topography at the upper surface of dielectric 16 if dielectric 16 is not planarized. Resulting from an uneven dielectric upper surface is poor step coverage of subsequent conductors placed within area 18. Planarization in area 20 is not as crucial as in area 18. Namely, area 20 does not present severe unevenness at the upper surface of conductors 14 and, thereby, will not produce densely patterned disparities in the upper surface topography of dielectric 16.

FIG. 2 not only illustrates the need for conformal dielectric 16 in area 20 and planarizable dielectric 16 in area 18, but also suggests problems associated with lack thereof. In particular, if the upper surface of dielectric 16 in area 18 is not substantially planar, then upper interconnect conductor 22a may experience step coverage problems. Moreover, conductor 22b in area 20 may be larger (wider) than conductor 22a due to another problem often referred to as "depth of focus" problem. Depth of focus problem results from lithography process and, more specifically, from a disparity in resist removal caused by the relative depth of the resist being removed. If the resist (and underlying interconnect) is at a lower elevation level (i.e., is "defocused") relative to an upper elevation level, then the defocused area will cause a wider line width. An illustrated example is shown by the difference between the wider interconnect 22b than that of the narrower interconnect 22a. A shorter wavelength and a smaller numerical aperture of the optical projection source will lessen the depth of focus problem, but will not eliminate it. It is therefore essential that the upper surface of dielectric be maintained as a substantially uniform planar surface both to minimize step coverage problems and depth of focus problems.

Many manufacturers and researchers have focused upon solutions to the planarization problem by carefully selecting the dielectric being used and by selectively etching or polishing the upper dielectric surface. U.S. Pat. No. 4,954,459 describes a dielectric which comprises either tetraethoxysilane (TEOS) or chemical vapor deposition (CVD) oxide. Select areas of the TEOS or CVD dielectric can be removed by subsequent etch-back and polishing steps in order to produce a highly planarized upper surface. While TEOS and CVD dielectrics are highly conformal, they are not highly planarizable unless subsequent etch-back and polishing steps are performed. Unfortunately, subsequent chemical or mechanical planarization steps (etch-back and polish) are time consuming and may leave additional contaminants upon the substrate topography. In order to provide a more planarizable dielectric than TEOS or CVD oxide, spin-on glasses (SOG) are often used. SOGs often called organic silicates (which includes siloxanes), are applied in liquid form across the upper surface of the substrate in the same manner as, for example, photoresist. The liquid silicate is then heated to convert it to a silica film. The liquid silicate easily flows into any deformational valley at the upper surface of the interconnect topography in order to fill and thereby planarize the upper surface. Unfortunately, SOG dielectrics are usually of a lower density than TEOS or CVD dielectrics. The SOG film undergoes a water sorption process that, when subjected to subsequent contact formation and aluminum deposition, causes water "outgassing" to occur. Water outgassing can lead to severe degradation and possible open-circuit failure in small contact windows etched through the SOG. See, e.g., Lifshitz, et al., "Water-Related Degradation of Contacts in the Multilevel MOS IC with Spin-On Glasses as Interlevel Dielectrics", *IEEE Electron Device Letters*, Vol. 10, No. 12, December 1989.

While TEOS and CVD dielectrics (oxides) are highly conformal and perform well in sparsely patterned areas 20, they do not perform well in densely patterned areas 18. Conversely, SOGs are well suited in densely patterned areas 18, but are usually avoided in sparsely patterned areas 20.

Additionally, since TEOS and CVD oxides cannot be easily planarized to suit areas 18 and while SOGs exhibit water outgassing, neither dielectric, in and of itself, provides an adequate solution to the planarization problem. Accordingly, many researchers and manufacturers have focused upon an interlevel dielectric comprising both a deposited oxide (CVD or TEOS) and an SOG. The multi-layered dielectric structure achieves the advantage of presenting a highly conformal dielectric within area 20 and a planarized upper surface within area 18. Unfortunately, the combinational dielectric structure often experiences severe cracking caused by intrinsic stresses within each layer as well as thermal expansivity problems between layers. It is possible that the primary source of the stress properties which cause cracking occur at the interface between the interconnect (or silicon substrate) and the dielectric. In many conventional designs, the dielectric comprises a sandwich structure of an SOG placed between CVD oxides. The CVD oxide which contacts the interconnect or substrate is subjected to significant thermal expansion stress at the juncture as well as inherent, intrinsic stress within the CVD (or TEOS) film.

SUMMARY OF THE INVENTION

The problems outlined above are in large part solved by the interlevel dielectric structure of the present invention. That is, the interlevel dielectric structure comprises a plasma enhanced CVD (PECVD) oxide placed at the juncture between substrate (and/or interconnect) and overlying TEOS oxide. The PECVD oxide is used to minimize the tensilly stressed TEOS overlayer. In particular, PECVD oxide is chosen as having a compressive stress factor which offsets the tensilly stressed TEOS oxide. In addition, PECVD oxide exhibits a lower expansion coefficient (relative to the underlayers of interconnect and substrate). A lower film expansivity difference between the PECVD and underlying substrate allows for a lower thermal mismatch at the juncture and therefore provides fewer stress points and possible cracks at the juncture as well as in the TEOS film.

PECVD film is highly conformal to dense patterns of underlying interconnect (and substrate), and provides a good base topography adherence for overlying TEOS oxide. Furthermore, PECVD oxide helps reduce stress at the juncture between the interconnect and TEOS to allow a thicker TEOS oxide and the advantages thereof. In particular, a thicker TEOS oxide can be deposited having some advantages of planarization. A thicker TEOS oxide lacking substantial intrinsic tensile stress and thermal expansivity differential provides not only a high quality dielectric, but also can produce a base surface for receiving a planarization upper layer in densely patterned areas.

While thicker TEOS does provide some advantages of planarization, thicker TEOS does not alone provide planarization absent an SOG overlayer. Accordingly, an SOG layer is deposited upon the thick TEOS oxide in order to fully planarize densely patterned areas and present an upper surface which is substantially uniform across the entire wafer topography. Still further, a capping layer of either PECVD oxide or TEOS oxide is formed above the SOG layer to (i) minimize sorption of water or hydrogen from the surrounding ambient into the SOG, and (ii) provide controlled thickness over areas in which a specific capacitance value is required.

In an alternative embodiment, the entire SOG layer as well as the upper portions of TEOS oxide are removed prior to the placement or deposition of the capping layer. By removing the entire SOG layer, outgassing of water during contact formation will be eliminated. Advantageously, SOG and TEOS layers are etched at substantially the same rate so as to provide a resulting, substantially planar upper surface which is then capped using either PECVD or TEOS oxide.

Preferably, the TEOS oxide is formed within an atmospheric pressure CVD chamber using a TEOS and ozone ambient. The ozone, $O_3$, is advantageously used to reduce the tensile stress within the TEOS oxide. As described below, the amount of $O_3$ deposited within the TEOS can be adjusted. If $O_3$ quantities are increased, then tensile stress is further reduced. A reduction in tensile stress reduces the amount of tensile stress, in relation to the compressive stress of the underlying PECVD oxide. A proper combination of the compressive stress of the underlayer PECVD oxide and the lower tensilly stressed TEOS oxide (as a result of $O_3$) further minimizes the possibility of stress points or cracks within the combination dielectric.

The present invention contemplates a method for forming a planarization structure of dielectric materials without removing the dielectric materials in non-contact areas prior to deposition of overlying conductors. The method comprises the steps of providing an integrated circuit topography comprising a plurality of conductors. The conductors are arranged at an elevation level disparity and at dissimilar pitch distances comprising a large gap distance and a small gap distance between the conductors. A plasma oxide is then deposited in a plasma enhanced CVD chamber upon the integrated circuit topography. Next, a TEOS oxide is deposited upon the plasma oxide. The TEOS oxide is deposited in an atmospheric pressure CVD chamber and within a TEOS and ozone ambient. The TEOS oxide comprises a thickness which is larger in the small gap distance than in the large gap distance such that a TEOS oxide thickness disparity exists between TEOS oxide thickness in the large and small gap distances. Next, a silicate (or siloxane) solution is spin deposited upon the TEOS oxide to form a silicate thickness which is larger in the large gap distance than in the small gap distance. Spin depositing the silicate solution is continued until a heating step causes the silicate solution to form a silica film having a substantially planarized upper surface. A silica thickness disparity exists between silica thickness in the large and small gap distances and the silica thickness disparity substantially equals the sum of the elevation level disparity and the TEOS oxide thickness disparity. Lastly, a capping dielectric is placed upon the silica film to complete the planarization, dielectric structure.

The present invention further contemplates an alternative exemplary methodology for forming a planarization structure which purposefully removes dielectric materials in non-contact areas prior to deposition of overlying conductors. The method utilizes the steps of providing an integrated circuit topography comprising a plurality of conductors having a large gap distance and a small gap distance between the conductors. A plasma oxide is then deposited upon the topography, and a TEOS oxide is deposited upon the plasma oxide. The TEOS oxide comprises a TEOS oxide upper surface in a small gap distance which is at a higher elevation level than the TEOS oxide upper surface in the large gap distance. A silicate solution is then deposited upon the TEOS oxide to form a silica film having a thickness which is larger in the large gap distance than in the small gap distance. The silica film comprises a silica upper surface which is substantially planar. Next, the silica film and a portion of the TEOS oxide are removed at substantially the same removal rate to produce a final upper surface which is planarized at an elevation level substantially equal to the TEOS oxide upper surface in the large gap distance. A capping dielectric is then deposited upon the final upper surface.

BRIEF DESCRIPTION OF THE DRAWINGS

Other objects and advantages of the invention will become apparent upon reading the following detailed description and upon reference to the accompanying drawings in which.

Figure 1:
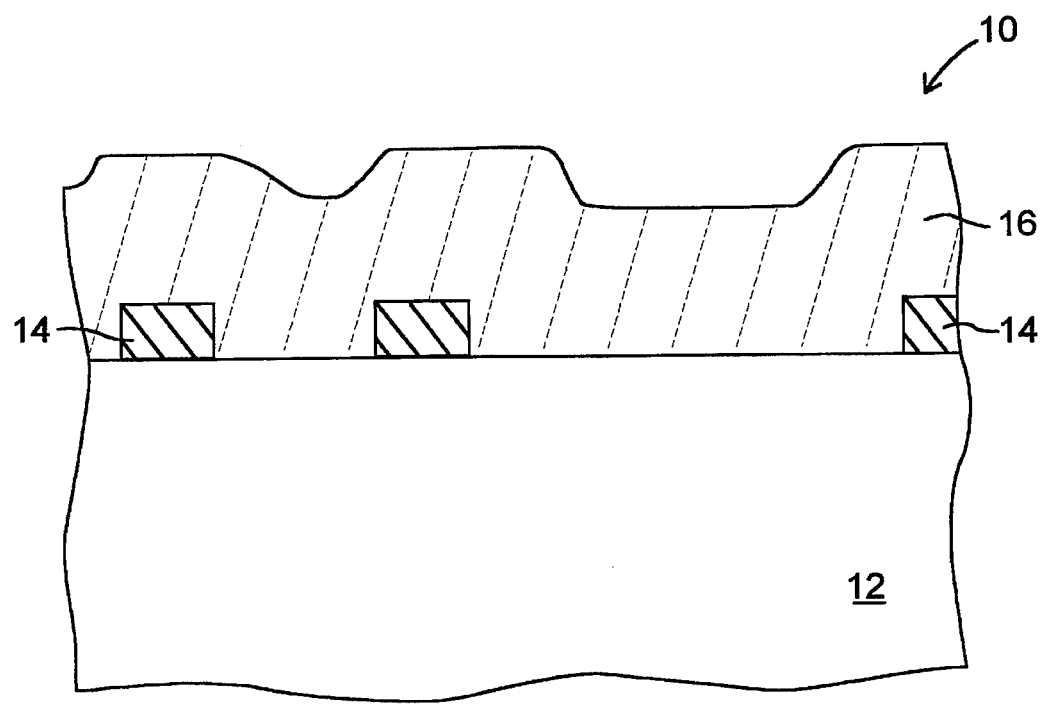
FIG. 1 is a partial cross-sectional view of an integrated circuit formed according to a prior processing methodology.
Figure 2:
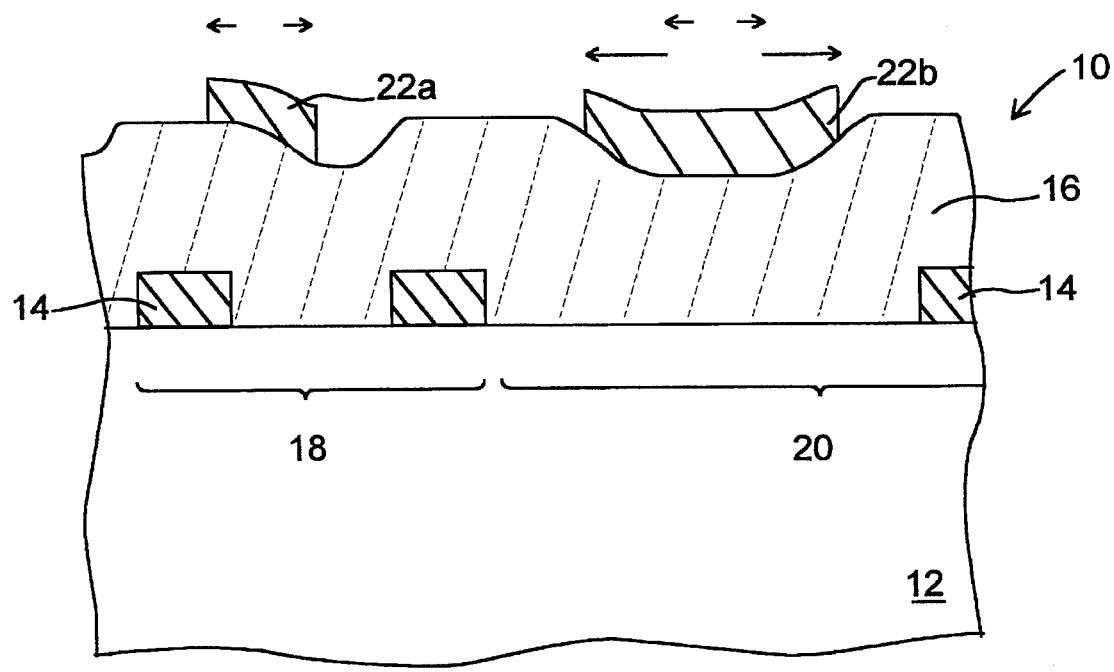
FIG. 2 is a partial cross-sectional view of an integrated circuit shown in FIG. 1 at a later stage of development and formed according a prior processing methodology.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
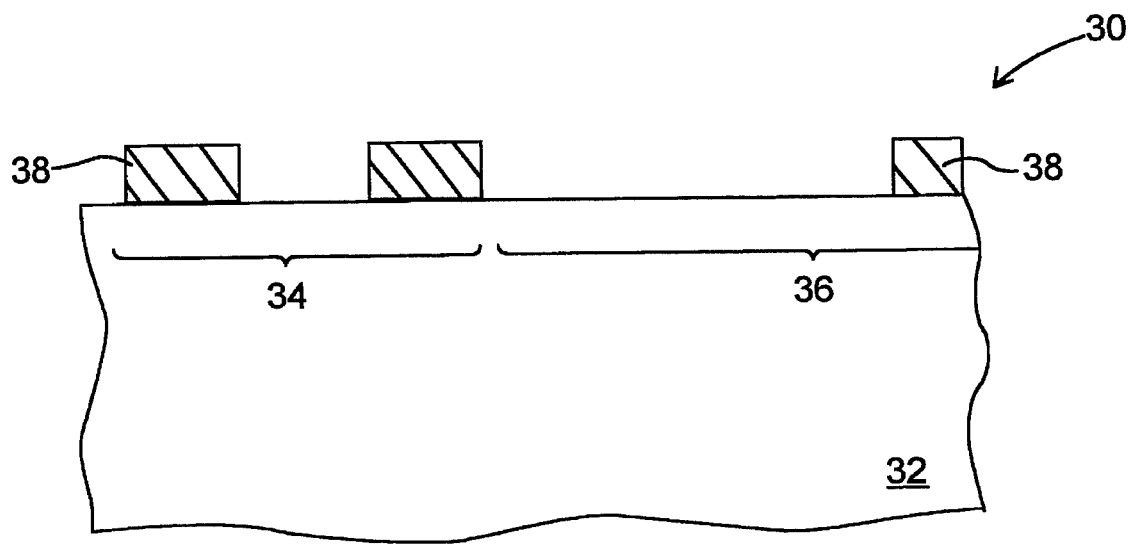
FIG. 3 is a partial cross-sectional view of an integrated circuit formed according to an early stage of development according to the present invention.

Turning now to FIG. 3, a partial cross-sectional view of an integrated circuit 30 is shown at an early stage in the development process. Integrated circuit 30 includes a silicon substrate 32 and area 34 of densely patterned conductors 38 as well as area 36 of sparsely patterned conductors 38. Conductors 38 can be somewhat thick (e.g., 3000 to 20,000 Å) and can be arranged in a dense fashion such as that normally found in a DRAM array. Conductors 38 are shown as the first layer or level of conductors. Subsequent layers are deposited and etched to form upper levels or layers of conductors, as described below. For simplicity, conductors 38 are illustrated substantially coplanar to each other. However, it is understood that conductors 38 can be arranged in active and inactive (field oxide) regions at different elevation levels thereby comprising elevational disparity between conductors. Accordingly, the upper surfaces of conductors 38 are generally at different elevation levels above the silicon substrate 32 and/or field oxides placed between substrate 32 and conductors 38. Moreover, it is understood that conductors 38 can be of any suitable conductive material including aluminum, aluminum silicide, polysilicon, etc.

Figure 4:
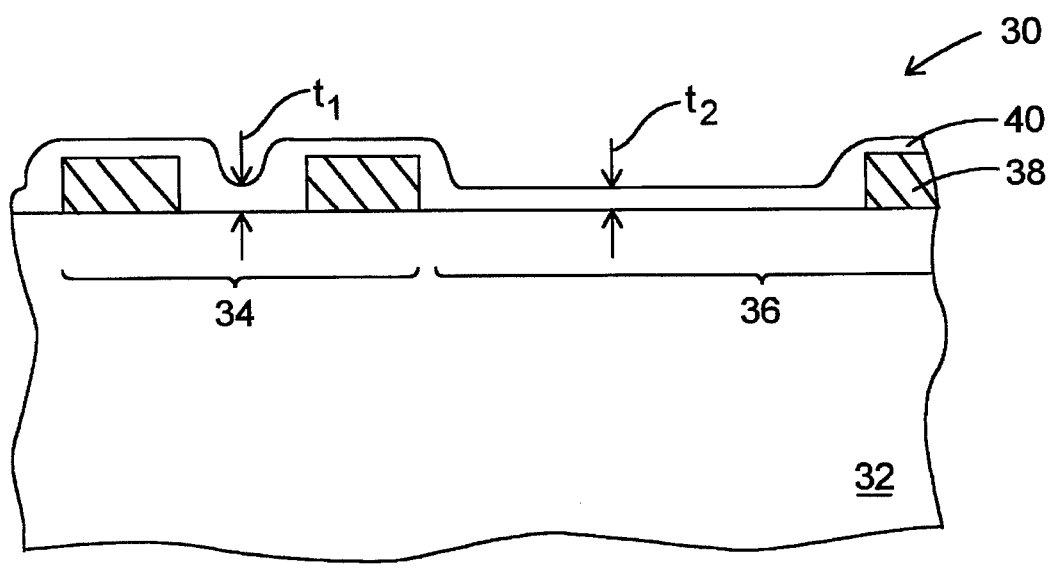
FIG. 4 is a partial cross-sectional view of an integrated circuit of FIG. 3 after deposition of a plasma oxide according to the present invention.

Referring now to FIG. 4, a plasma oxide 40 is deposited upon the upper surface of substrate 32 (and/or field oxides) as well as on the upper and side surfaces of conductors 38. Plasma oxide 40 is deposited at a thickness of approximately 2000 Å, and is highly conformal about the upper topography. In area 34, plasma oxide 40 conforms to the narrow spacing between conductors 38 and, depending upon said spacing, can form a thickness $t_1$ greater than the thickness $t_2$ in sparsely patterned area 36. Thickness $t_1$, however, is not sufficiently thick so as to provide an upper planarized surface within area 34. The conformal nature of plasma oxide 40 thereby provides an initial disparity in the to-be-formed planarization structure. The initial disparity, however, is purposefully offset by subsequent dielectric layers.

An important advantage of plasma oxide 40 is its formation. Namely, plasma oxide 40 is formed in the plasma enhanced CVD (PECVD) chamber. PECVD films utilize a reaction gas of, for example, silane ($SiH_4$). To initiate the plasma reaction process, silane reacts with, for example, oxygen or derivatives thereof, to form a reaction as follows:

$$SiH_4 + 2N_2O \rightarrow SiO_2 + 2H_2 + 2N_2$$

As a result of PECVD reaction, stoichiometry can deviate somewhat from $SiO_2$ and a substantial amount of hydrogen may be incorporated in the resulting film. However, the benefit from PECVD is a lower temperature reaction. Silicon dioxide (oxide) is formed at a temperature range from 200° C. to 400° C., substantially less than the 600° C. to 1200° C. range for normal CVD reaction. Another important advantage of plasma oxide films generally relates to a lower internal or intrinsic stress property of the plasma film, as opposed to normal CVD films. Lower intrinsic stress plasma films are less likely to crack when they are deposited in thick layers.

Intrinsic stress of plasma oxide 40 is measured in numerous ways. Generally speaking, stress is a function of expansion coefficient at the interface between layer 40 and underlayers as well as within in the internal properties of the film. Thus, total stress S is calculated as follows:

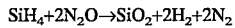

$$S = \frac{(\alpha_f - \alpha_s) E_f \Delta T}{1 - v_f} + S_i$$

Where $\alpha_s$ is the expansion coefficient of the substrate and $\alpha_f$ is the expansion coefficient of the oxide film. $E_f$ is Young's modulus of the film, $\Delta T$ is the deposition temperature minus room temperature, $v_f$ is Poisson's ratio of the oxide, and $S_i$ is the internal stress of the film. $S_i$ is process dependent and can be highly variable. Each of the above variables are well defined in semiconductor process technology and are well known to those skilled in the art. It is also well known that TEOS oxide is tensilely stressed. Tensile stress is measured as a positive stress from the above formula and is generally defined as a greater film expansivity than the underlying wafer (substrate) expansivity. Opposite to tensile stress is "compressive stress". Compressive stress involves a higher substrate expansivity than film expansivity. Being tensilly stressed, upper layers of TEOS oxide have a tendency to "pull apart" the internal structure of the TEOS as it is cooled. Resulting cracks in the TEOS oxide are common place unless compensated by an offsetting stress in an underlayer. Plasma oxides not only exhibit a lower intrinsic stress than do CVD oxides, but advantageously exhibit compressive stress. The compressive stress of oxide 40 functions to offset tensile stress of upper layer TEOS oxide to present a "stress balanced" dielectric structure. Accordingly, as circuit 30 cools after each and every thermal cycle, balanced stress between plasma oxide 40 and overlying TEOS oxide 42 (shown in FIG. 5) substantially prevents or minimizes cracks within the TEOS oxide. Any cracks which form within the dielectric can cause possible shorting paths between conductors 38 and overlying conductors 44 (shown in FIGS. 8a and 8b).

Figure 5:
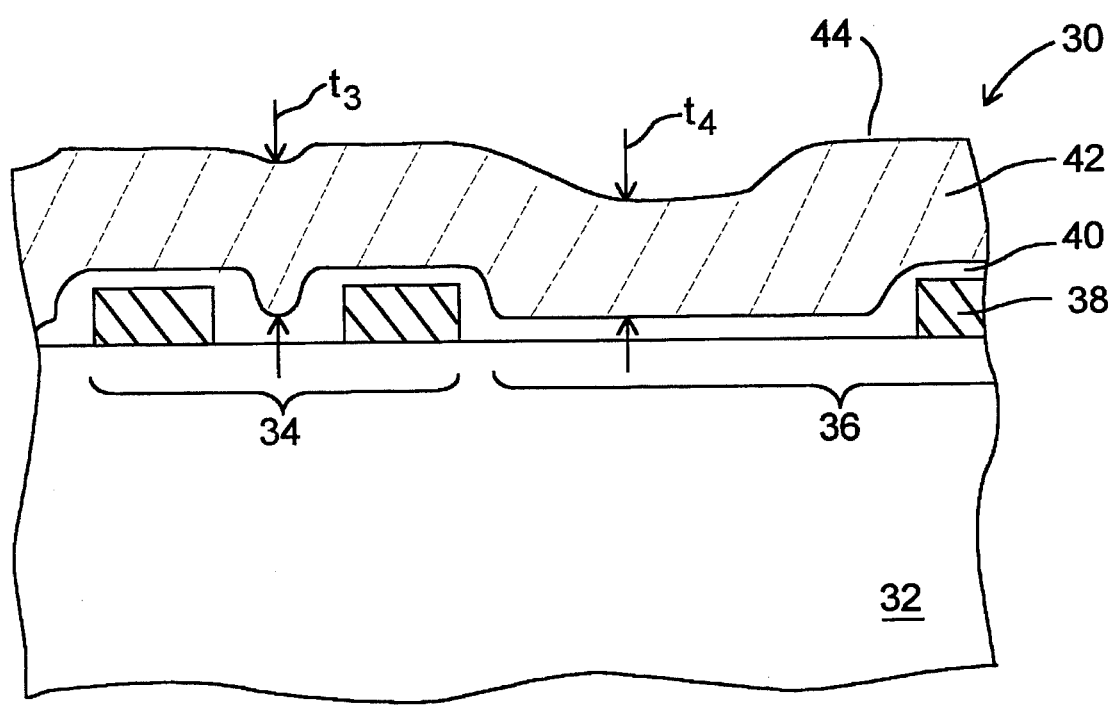
FIG. 5 is a partial cross-sectional view of an integrated circuit of FIG. 4 after deposition of a TEOS oxide according to the present invention.

Referring to FIG. 5, a stress balanced structure at the interface between TEOS oxide 42, plasma oxide 40 and substrate 32 is presented whereby the total stress does not exceed $1 \times 10^9$ dynes/cm² over the whole range of temperatures to which the films are subjected. Moreover, stress balancing allows a thicker TEOS oxide 42 to be deposited than in conventional TEOS formations. In particular, TEOS oxide 42 is deposited at a thickness range of 6000 to 10000 Å. The thicker oxide is substantially free of stress points and resulting cracks which would normally occur in a non-stress balanced structure. The thicker TEOS oxide provides a more planar upper surface 44 and a substantial disparity between the thickness $t_3$ in region 34 and thickness $t_4$ in region 36. Thickness disparity can range anywhere from 1:1.1 to over 1:1.3, whereas thickness $t_3$ is advantageously greater than thickness $t_4$. Thickness $t_3$ is greater than thickness $t_4$ so as to provide a somewhat planarized upper surface 44 in densely patterned, uneven substrate topography area 34. Additionally, upper surface 44 is relatively conformal in sparsely patterned region 36. The advantages of a thicker TEOS oxide 42 and thickness disparity (planarization) of the upper surface 44 will be made evident with reference to the remaining figures. It is important, however, that for reasons described below, the lowest elevational point for upper surface 44 is above any and all plasma oxide 40. A thicker TEOS oxide provides such elevational assurances.

TEOS oxide 42 is formed upon plasma oxide 40 by placing substrate 32 (wafer) within an atmospheric pressure CVD (APCVD) reactor. A gas flow of TEOS in conjunction with ozone ($O_3$) is placed in a flow pattern across the substrate upper surface. The TEOS and ozone mix and react in a gas phase upon the substrate upper surface leaving TEOS oxide 42 on oxide 40 while byproducts are evacuated from the reaction site. If the concentration of ozone is increased within the TEOS oxide, then tensile stress is correspondingly decreased. In order to ensure that sufficient amounts of ozone are placed within film 42, it is important that the ozone does not degrade prior to its deposition. Namely, higher temperatures enhance the degradation of ozone as follows:

If the APCVD system is heated to a temperature exceeding 400° C. in the reaction zone (i.e., at a range above the wafer but less than one cm. thereabove), then almost all of the ozone will be consumed prior to its deposition. Thus, it is important the APCVD system hereof be maintained at a temperature in the reaction zone of approximately 100° to 200° C. If the temperature falls below 100° C., then a predominant of ozone exists in the gas mixture and is sent from the APCVD exhaust instead of being properly mixed and deposited. By varying the temperature within the deposition range and by varyng the $O_3$ flow rate, fluctuation in tensile stress of the resulting TEOS can be adjusted to change the balance of stress with the underlying PECVD material. An exemplary APCVD system utilizing both TEOS and ozone is described below in reference to FIG. 9.

Figure 6A:
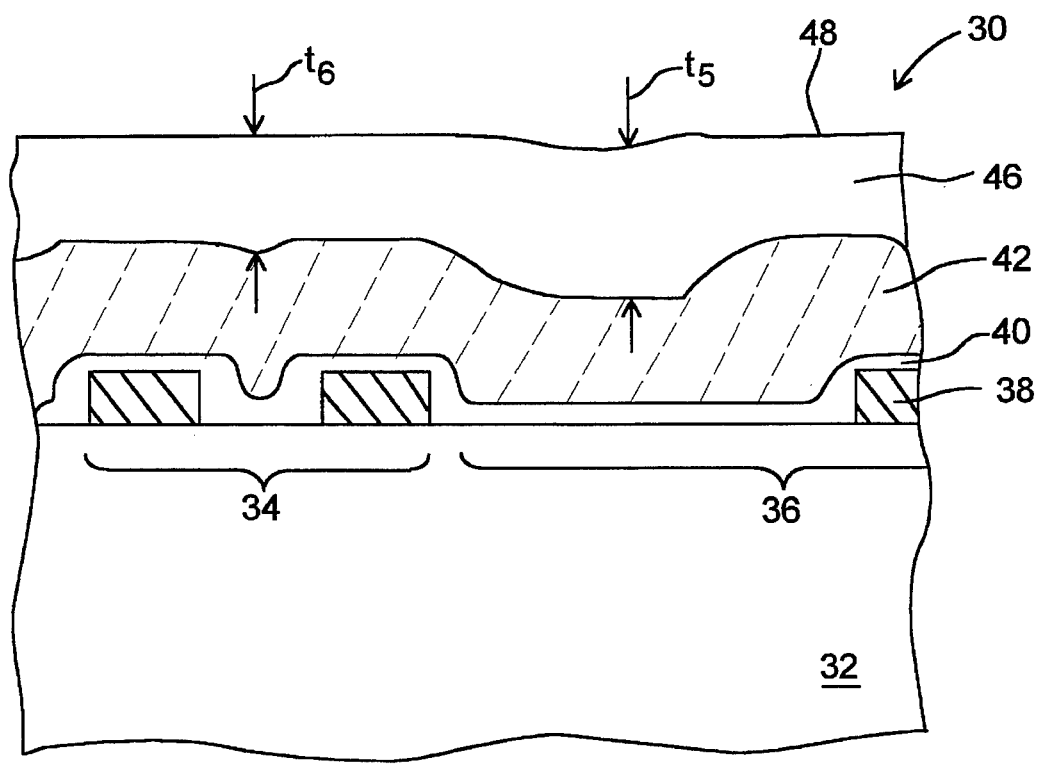
FIG. 6a is a partial cross-sectional view of an integrated circuit of FIG. 5 after deposition of SOG oxide according to an exemplary embodiment of the present invention.

Referring now to FIG. 6a, a spin-on glass (SOG) film 46, such as an alkoxysilane, tetraethoxysilane methylsiloxane or acyloxysilane (each being placed in a solvent) is spin deposited on TEOS oxide 42. A variety of well known spin-on polymers can also be used such as, for example, silsesquioxane. The liquid is then heated to convert it to a silica film. When tetraethoxysilane (TEOS) based solution is used, a catalytic agent (initiator) along with heat is ordinarily used to covert the TEOS to silica. When a doped film is made, the doping agent itself, for example, $POCl_3$, may suffice as the initiator. A suitable siloxane-based SOG can be obtained from Allied-Signal, Milpitas, Calif., as tradename Accuglass® X-11 series product. SOG 46 can be deposited to thicknesses in the range of 1000 Å to 9000 Å and is heated in the range of 350° C. to 450° C. The primary advantage of SOGs is the simplicity of applying a layer to a wafer, and have an additional advantage of topography planarization. Thus, upper surface 48 of SOG 46 is substantially planar, wherein the silica thickness $t_5$ is greater than silica thickness $t_6$ in regions 36 and 34, respectively. A thickness disparity between thicknesses $t_5$ and $t_6$ ranges anywhere from 1:1.1 to 1:2.0 in order to offset the thickness disparity in TEOS oxide 42 and thereby present a substantially planar upper surface 48.

Figure 6B:
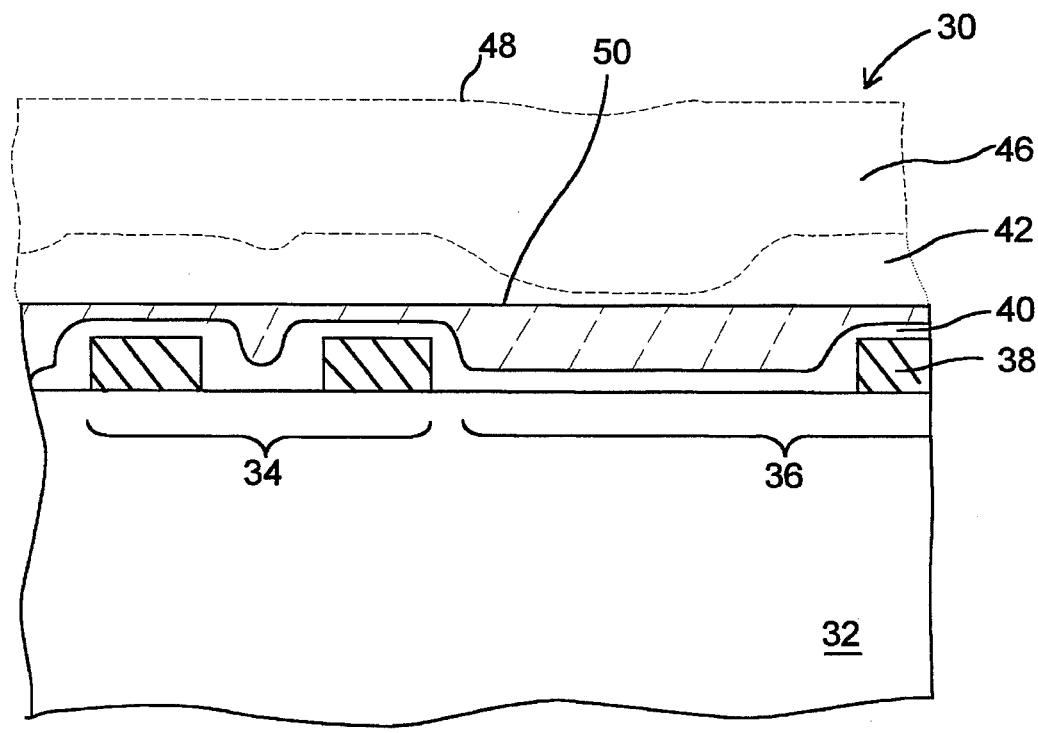
FIG. 6b is a partial cross-sectional view of an integrated circuit of FIG. 5 after deposition of sacrificial SOG oxide according an alternative exemplary embodiment of the present invention.

SOG film 46 presents many problems which can affect reliability of an integrated circuit. One problem stems from the lower density of SOG in relation to TEOS oxide or plasma oxide. The lower density SOG has a tendency to absorb water thereby causing "outgassing" of the water when contact windows are formed through the SOG. Outgassing of moisture in the contact windows adversely affects contact conductivity and should in most instances be avoided. One way to avoid the problems of SOG moisture absorption is to remove the entire SOG layer after its deposition—i.e., remove a "sacrificial" SOG layer. Referring to FIG. 6b, SOG layer 46 is removed at substantially the same etch rate as the removal of underlying, upper portions of TEOS oxide 42. By maintaining substantially the same etch rate, and using preferably a wet etchant, such as HF, the substantially planar upper surface 48 can be maintained to an etch-back upper surface 50. Suitable other etchants can also be used such as plasma etchants or chemical mechanical polishing techniques. Etch-back upper surface 50 is at approximately the same elevational level as the lowest elevation level of TEOS oxide 42 upper surface. By maintaining TEOS oxide 42 upper surface within an area 36 above TEOS oxide 42 lower surface within area 34, etch-back upper surface 50 is assured of having a defined thickness of TEOS oxide 42 remaining across the entire wafer surface.

Figure 7A:
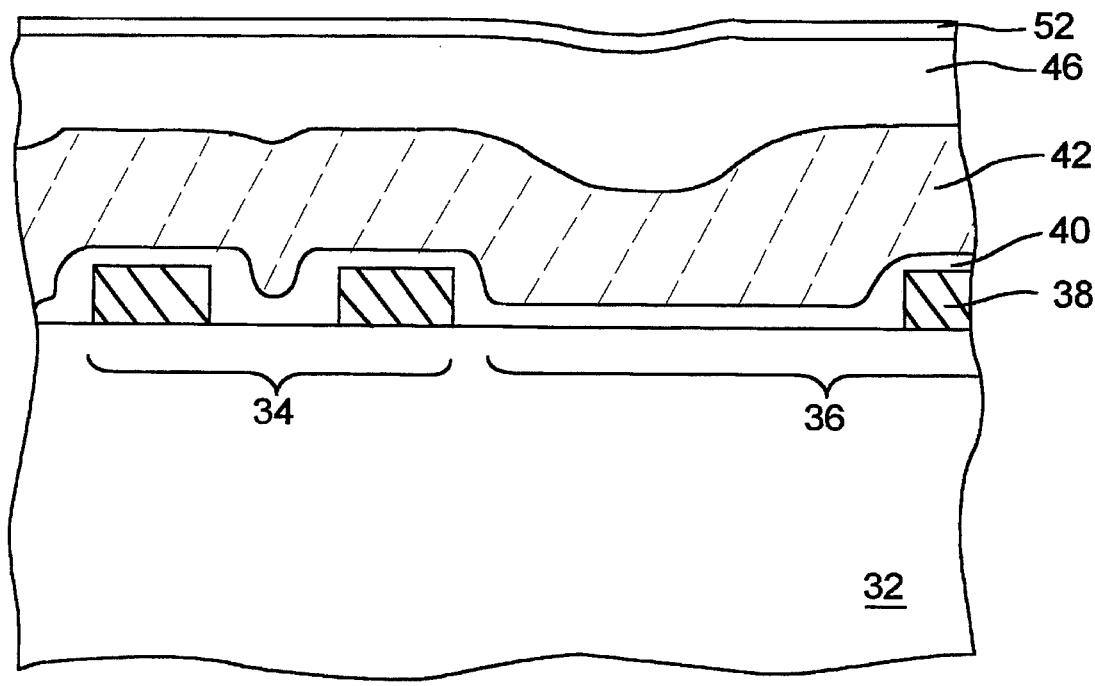
FIG. 7a is a partial cross-sectional view of an integrated circuit of FIG. 6a after deposition of a capping layer according to the present invention.

Referring now to FIG. 7a, an illustration is provided of an embodiment in which an etch-back procedure is not used. A capping layer 52 can be deposited upon SOG layer 46 without previously removing the SOG layer. Capping layer 52 of FIG. 7a is therefore shown placed upon the upper surface 48 of SOG 46, illustrated in FIG. 6a. Capping layer 52 is preferably a CVD oxide and is formed as either a TEOS oxide or a plasma oxide. Preferably, however, capping layer 52 is a plasma oxide which is highly conformal to upper surface 48 of SOG 46. Capping layer 52 provides a barrier against water sorption into the underlying SOG from a moisture ambient. Water and associated free hydrogen is thereby prevented from ingress into the SOG, and is further prevented from migrating from the SOG into underlying transistor channel regions. Any hydrogen within the channel region can affect minority carriers within the channel and therefore skew turn-on thresholds. Capping layer 52 can be deposited at a controlled thickness upon SOG 46 to provide a close tolerance to capacitance value for the entire dielectric structure (plasma oxide 40, TEOS oxide 42 and SOG 46). Thus, capping layer 52 can have a variable thickness depending upon the desired capacitance outcome of the resulting dielectric. Any upper interconnect conductors placeable upon capping layer 52 incur a specific capacitance based upon the variability of the capping layer thickness relative to the remaining dielectric layers.

Figure 7B:
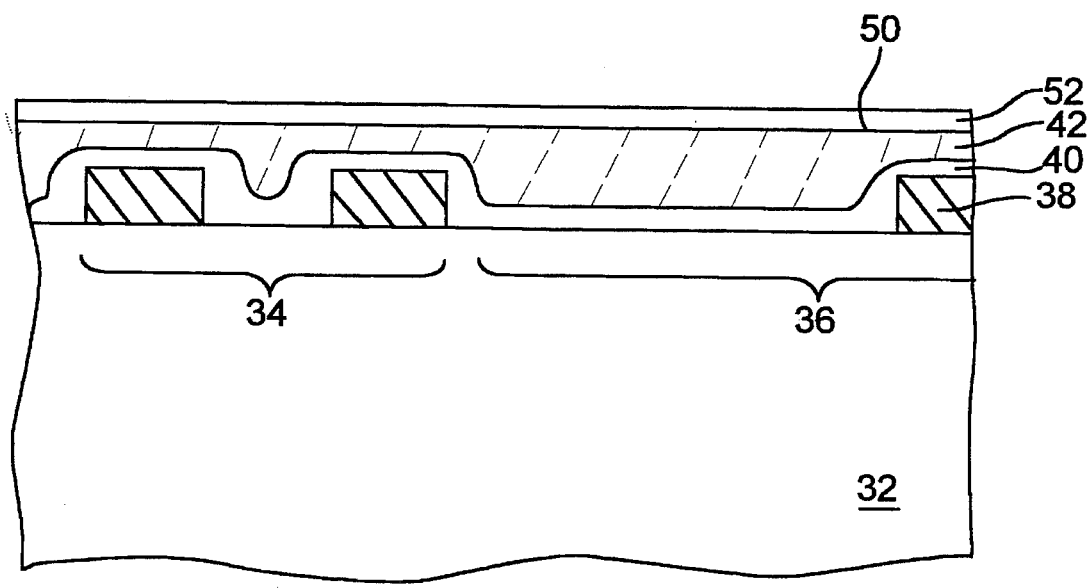
FIG. 7b is a partial cross-sectional view of an integrated circuit of FIG. 6b after deposition of a capping layer according to the present invention.

Alternatively, capping layer 52 can be placed upon an etch-back upper surface 50 of FIG. 6b, as shown in FIG. 7b. Capping layer 52, in either embodiments of FIG. 7a or 7b, provide the advantages described above. Capping layer 52 upon etch-back upper surface 50, shown in FIG. 7b, ensures that the lower density TEOS oxide will not absorb moisture from an outside ambient. Capping layer 52 provides a barrier against absorption similar to the barrier formed above SOG layer 46, as shown in FIG. 7a.

Figure 8A:
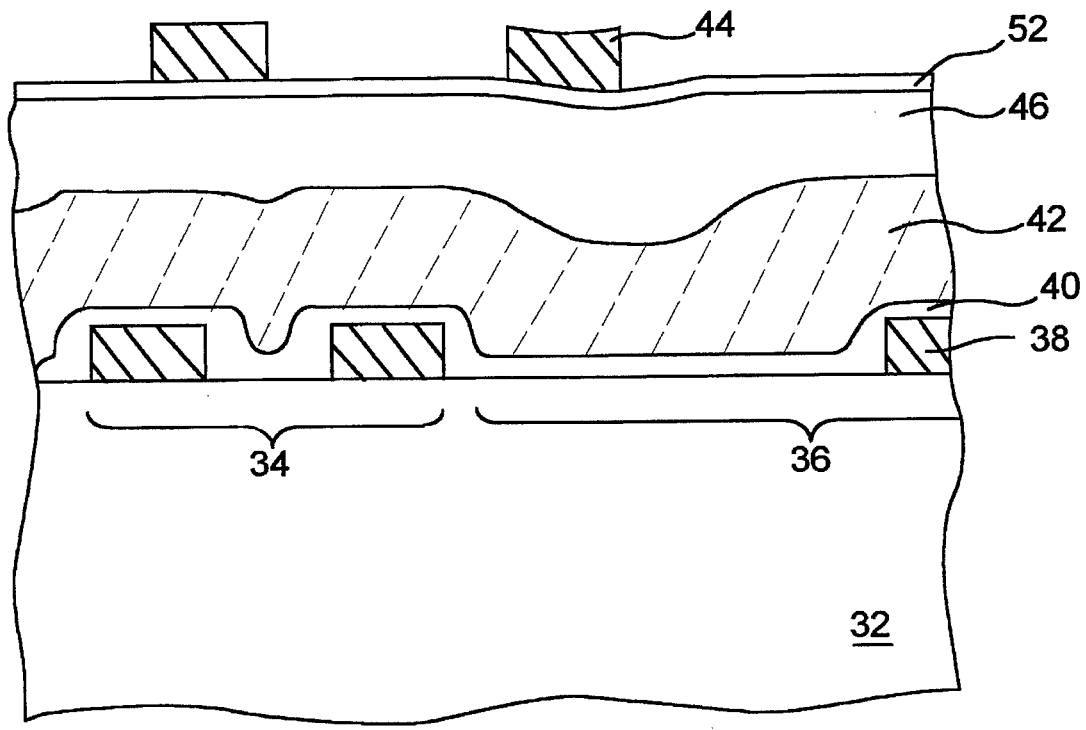
FIG. 8a is a partial cross-sectional view of an integrated circuit of FIG. 7a after deposition of an upper interconnect layer according to the present invention.
Figure 8B:
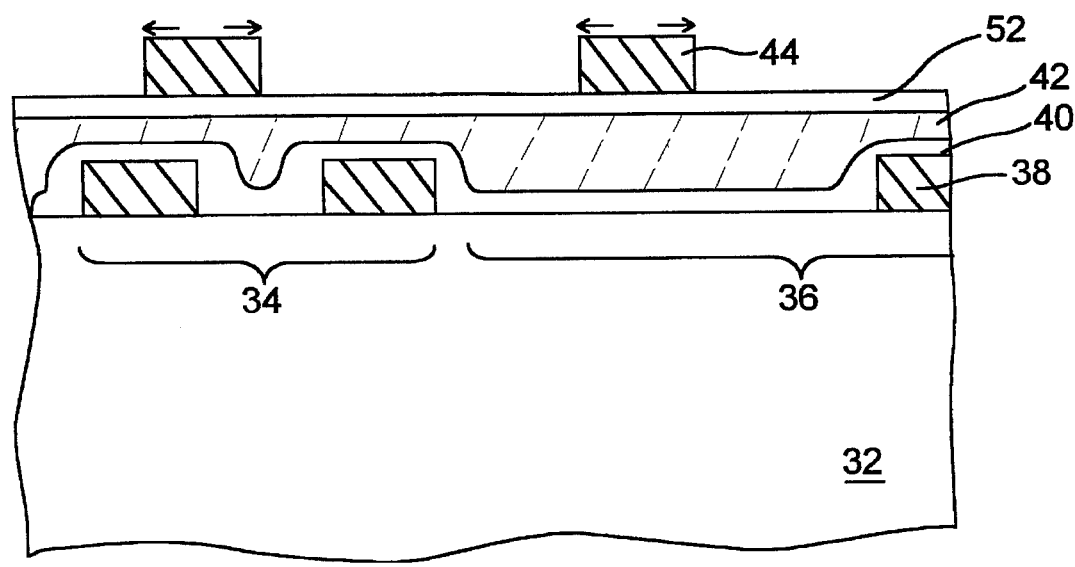
FIG. 8b is a partial cross-sectional view of an integrated circuit of FIG. 7b after deposition of an upper interconnect layer according to the present invention.

Referring now to FIG. 8a, upper interconnect conductors 44 are shown deposited upon the upper surface of capping layer 52. Conductors 44 form another level of conductors in a multi-level arrangement of interconnect. Multi-level conductors are commonly used in high density integrated circuit applications. It is understood that the procedures described in FIGS. 3-7 can be repeated for numerous levels of interconnect (more than two) to achieve even higher interconnect densities. Conductors 44 of FIG. 8a are shown placed in the embodiments illustrated in the previous processing steps of FIGS. 6a and 7a. FIG. 8b illustrates upper interconnect conductors 44 placed upon capping layer 52 subsequent to the processing steps of the embodiments illustrated in FIGS. 6b and 7b.

Figure 9:
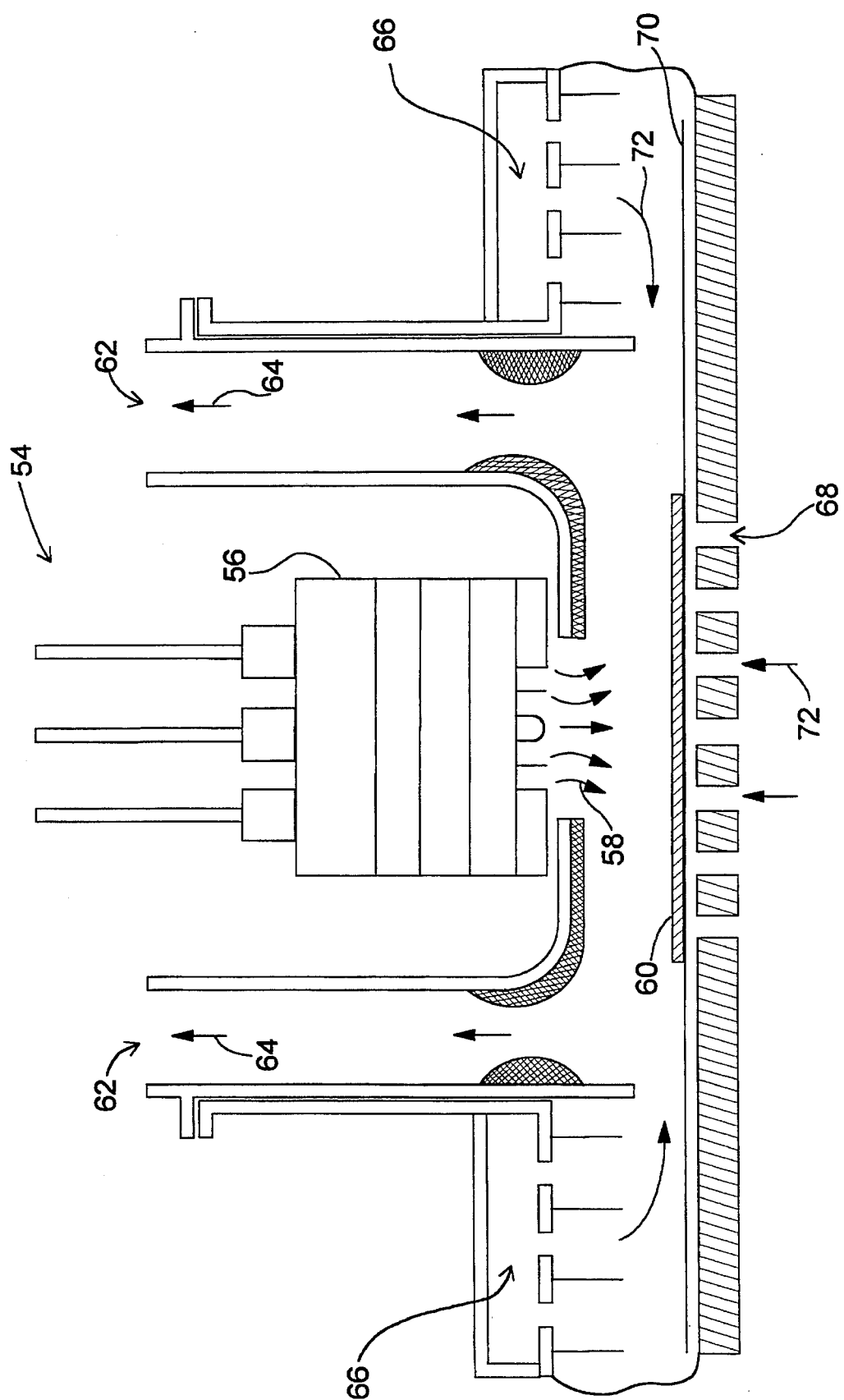
FIG. 9 is an atmospheric pressure CVD unit for depositing TEOS oxide in a TEOS and ozone ambient according to the present invention.

A desired outcome of the dielectric structure hereof (layers 40, 42, 46 and 52) is to not only achieve a upper planarized surface which produces minimal depth of focus problems, but also provides a dielectric with low stress properties and with a capping barrier against water or contamination absorption into the underlying dielectric. By placing a plasma oxide layer 40 prior to TEOS oxide 42, the resulting dielectric has low stress properties. Moreover, stress is controlled by minimizing the intrinsic stress (tensile stress) within TEOS oxide 42. FIG. 9 illustrates APCVD reactor 54 used for depositing TEOS oxide 42. Reactor 54 includes an injector 56 for injecting gaseous TEOS and ozone 58 into a mixing area directly above wafer 60. The unused material is purged through outlet exhaust 62 in the direction indicated by arrows 64. Nitrogen is often used as the purge carrier, and is generally inserted through purge curtains 66 and through perforations 68 arranged beneath conveyor belt 70 and wafer 60. Insertion of nitrogen carrier is shown along arrows 72. An APCVD system, similar to that shown in FIG. 9, is available from, for example, Watkins-Johnson Company, Palo Alto, Calif. Functionality and structural description of a suitable Watkins-Johnson APCVD system is described in U.S. Pat. No. 5,122,391 to Mayer (herein incorporated by reference).

While APCVD systems provide suitable deposition of silicon dioxide from a TEOS reactant, APCVD systems using an ozone reactor as described herein provide additional advantages beyond normal APCVD reactions which lack ozone. Namely, ozone provides an adjustable tensilly stressed TEOS oxide generally of less tensile stress than non-ozone TEOS oxide. When added to the plasma oxide underlayer, the ozone TEOS provides a dielectric structure having a lesser tendency to crack and also provides an improved flow-like coverage in dense areas.

It will be appreciated to those skilled in the art having the benefit of this disclosure that this invention is believed to be capable of applications with multiple levels of interconnect and therefore can be repeated to form dielectric structures between each level of interconnect. Furthermore, it is also to be understood that the form of the invention shown and described is to be taken as exemplary, presently preferred embodiments. The SOG layer can be retained or completely removed prior to deposition of a capping layer. If it is desired that the SOG layer be removed, etching is used to remove the SOG layer. Various modifications and changes may be made without departing from the spirit and scope of the invention as set forth in the claims. It is intended that the following claims be interpreted to embrace all such modifications and changes.

What is claimed is:

1. A method for forming a planarization structure of dielectric materials, said method comprising the steps of:

providing an integrated circuit topography comprising a plurality of conductors, wherein said conductors are arranged at an elevation level disparity and at dissimilar pitch distances comprising a first gap distance and a second gap distance between said conductors, wherein such second gap distance is smaller than said first gap distance;

depositing in a plasma enhanced chemical vapor deposition (CVD) chamber a plasma oxide upon said topography;

depositing in an atmospheric pressure CVD chamber, from a tetraethoxysilane (TEOS) and ozone source gas, a TEOS oxide upon said plasma oxide, wherein said TEOS oxide comprises a thickness which is larger in said second gap distance than in said first gap distance such that a TEOS oxide thickness disparity exists between TEOS oxide thickness in said first and second gap distances;

without removing any portion of said TEOS oxide, spin depositing a silicate solution upon said TEOS oxide to form a silicate thickness which is larger in said first gap distance than in said second gap distance;

baking said silicate solution to remove solvents and then heating said silicate solution to form a silica film having a substantially planarized upper surface, wherein a silica thickness disparity exists between silica thickness in said first and second gap distances and said silica thickness disparity substantially equals a sum of said elevation level disparity and said TEOS oxide thickenss disparity; and depositing a capping dielectric upon said silica film.

2. The method as recited in claim 1, second gap distance is less than 0.5 μm and said first gap distance is greater than 3.0 μm.

3. The method as recited in claim 1, wherein said plasma oxide having an intrinsic stress of $8 \times 10^8$ to $5 \times 10^9$ dynes/cm$^2$.

4. The method as recited in claim 1, wherein said silicate solution comprises TEOS suspended in a solvent.

5. The method as recited in claim 1, wherein said plasma oxide and said TEOS oxide comprise SiO$_2$.

6. The method as recited in claim 1, wherein said capping dielectric comprises a silicon dioxide formed within said plasma enhanced CVD chamber.

7. The method as recited in claim 1, wherein said capping dielectric comprises an oxynitride formed within said plasma enhanced CVD chamber.

8. The method as recited in claim 1, wherein said sum of said elevation level disparity and said TEOS oxide thickness disparity is an inverse of said silica thickness disparity.

* * * * *

UNITED STATES PATENT AND TRADEMARK OFFICE
CERTIFICATE OF CORRECTION

PATENT NO. : 5,503,882
DATED : April 2, 1996
INVENTOR(S) : Robert Dawson

It is certified that error appears in the above-indentified patent and that said Letters Patent is hereby corrected as shown below:

Claim 2, col. 11, line 1, please insert --wherein said-- after "claim 1," and before "second".

Signed and Sealed this

Second Day of July, 1996

Attest:

BRUCE LEHMAN

Attesting Officer

Commissioner of Patents and Trademarks